(12) United States Patent
Fujisawa et al.

(10) Patent No.: US 8,093,490 B2
(45) Date of Patent: Jan. 10, 2012

(54) METHOD FOR FORMING THIN FILM, SUBSTRATE HAVING TRANSPARENT ELECTROCONDUCTIVE FILM AND PHOTOELECTRIC CONVERSION DEVICE USING THE SUBSTRATE

(75) Inventors: Akira Fujisawa, Osaka (JP); Yukio Sueyoshi, Osaka (JP); Masahiro Hirata, Osaka (JP); Toru Yamamoto, Osaka (JP); Koichiro Kiyohara, Osaka (JP); Kiyotaka Ichiki, Osaka (JP)

(73) Assignee: Nippon Sheet Glass Company, Limited, Tokyo (JP)

( * ) Notice: Subject to any disclaimer, the term of this patent is extended or adjusted under 35 U.S.C. 154(b) by 1120 days.

(21) Appl. No.: 10/497,367

(22) PCT Filed: Dec. 3, 2002

(86) PCT No.: PCT/JP02/12620
§ 371 (c)(1), (2), (4) Date: Jan. 3, 2005

(87) PCT Pub. No.: WO03/048411
PCT Pub. Date: Jun. 12, 2003

(65) Prior Publication Data
US 2005/0121070 A1 Jun. 9, 2005

(30) Foreign Application Priority Data

Dec. 3, 2001 (JP) ................................ 2001-368352
Dec. 3, 2001 (JP) ................................ 2001-368662
Oct. 4, 2002 (JP) ................................ 2002-293095
Oct. 4, 2002 (JP) ................................ 2002-293096

(51) Int. Cl.
*H01L 31/00* (2006.01)

(52) U.S. Cl. ....................................................... 136/252
(58) Field of Classification Search ................... 136/252
See application file for complete search history.

(56) References Cited

U.S. PATENT DOCUMENTS

| 4,100,330 | A | * | 7/1978 | Donley ......................... 428/429 |
| 4,663,494 | A | * | 5/1987 | Kishi et al. .................... 136/244 |
| 4,853,257 | A | | 8/1989 | Henery |
| 4,880,664 | A | * | 11/1989 | O'Dowd et al. .............. 427/109 |
| 5,041,150 | A | | 8/1991 | Grundy et al. |

(Continued)

FOREIGN PATENT DOCUMENTS

EP 0 755 902 A 1/1997

(Continued)

*Primary Examiner* — Alexa Neckel
*Assistant Examiner* — Miriam Berdichevsky
(74) *Attorney, Agent, or Firm* — Hamre, Schumann, Mueller & Larson, P.C.

(57) ABSTRACT

The present invention provides a thin film-forming method by which, even when a thin film containing a crystalline metal oxide as the main component is formed over a wide area within a short time utilizing a thermal decomposition method, the thickness of the thin film becomes relatively uniform. A thin film-forming method of the present invention includes forming a thin film using a raw material containing a chloride of a metal, and prior to the forming of the thin film, 1) disposing metal-containing particles on the substrate, or 2) forming, at a film deposition rate slower than a film deposition rate for the thin film, a metal-containing thin film on the substrate, and wherein, in the case of the step 2), the thin film containing the metal oxide as the main component is directly formed on the metal-containing thin film.

4 Claims, 5 Drawing Sheets

U.S. PATENT DOCUMENTS

| | | | |
|---|---|---|---|
| 5,487,784 A | 1/1996 | Ellis, Jr. | |
| 5,677,236 A * | 10/1997 | Saitoh et al. | 438/485 |
| 6,238,738 B1 * | 5/2001 | McCurdy | 427/255.19 |
| 6,362,414 B1 | 3/2002 | Fujisawa et al. | |
| 6,840,061 B1 * | 1/2005 | Hurst et al. | 65/60.51 |
| 2001/0013361 A1 * | 8/2001 | Fujisawa et al. | 136/256 |

FOREIGN PATENT DOCUMENTS

| | | |
|---|---|---|
| EP | 1 054 454 A | 11/2000 |
| EP | 1 143 501 A1 | 10/2001 |
| JP | 2-175631 A | 7/1990 |
| JP | 3-180462 A | 8/1991 |
| JP | 6-47482 B | 6/1994 |
| JP | 9-40442 A | 2/1997 |
| JP | 2862174 B | 12/1998 |
| JP | 11-180734 A | 7/1999 |
| JP | 11-509895 | 8/1999 |
| JP | 2001-35262 A | 2/2001 |
| WO | 88/09265 | 12/1988 |
| WO | 97/42357 | 11/1997 |

\* cited by examiner

METHOD FOR FORMING THIN FILM, SUBSTRATE HAVING TRANSPARENT ELECTROCONDUCTIVE FILM AND PHOTOELECTRIC CONVERSION DEVICE USING THE SUBSTRATE

TECHNICAL FIELD

This invention relates to a method of forming, on a substrate such as glass, a thin film containing a crystalline metal oxide as the main component using a chloride of a metal as a raw material, by a thermal decomposition method. The invention further relates to a substrate in which the thin film containing a crystalline metal oxide as the main component functions as a transparent conductive film, and to a photoelectric conversion element using the substrate.

BACKGROUND ART

A thin film containing a metal oxide such as tin oxide has the function of reflecting infrared rays. Since a glass sheet provided with this thin film reduces the total solar energy transmittance and does not allow the heat within rooms to escape to the outdoors, it is widely available in the market as a low-emissivity glass. This thin film also can exhibit the function of shielding electro-magnetic waves. A known method for manufacturing a glass sheet of this kind is such that a thin film of a metallic compound is formed on a high temperature glass surface utilizing thermal decomposition methods, such as a chemical vapor deposition method (CVD method) and a spraying method in which a solution material or a solid material is sprayed.

For example, JP 11(1999)-509895 A describes a method of forming a thin film of a tin oxide by supplying a gaseous reaction mixture containing an organic tin compound, hydrogen fluoride, oxygen, and water onto a high temperature glass surface. JP 6(1994)-47482 B describes a method of forming a thin film comprising a tin oxide by supplying a vapor of an organic tin compound on a glass ribbon surface in a float bath in a float manufacturing process. The use of the organic tin compounds such as described in these patent publications as a raw material for a thin film has an advantage that the thickness of the thin film easily is made uniform. Nevertheless, because organic tin compounds have high environmental loads as with tributyltin compounds, the use of alternative raw materials that replace organic tin compounds has been desired in recent years.

Meanwhile, tin chloride conventionally has been used widely as a raw material for a tin oxide thin film in thermal decomposition methods. For example, JP 2(1990)-175631 A describes a method of forming a coating film in which, with a CVD method, a first flow of tin tetrachloride and a second flow of water vapor are supplied onto a glass with a turbulent flow. Also, JP 9(1997)-40442 A describes a method of depositing a tin oxide thin film uniformly by a CVD method, in which tin tetrachloride and water are pre-mixed and supplied onto a glass substrate with a laminar flow.

Such methods of forming a thin film containing a metal oxide that utilize thermal decomposition methods are inferior to physical vapor deposition methods, such as a sputtering method, in that it is difficult to obtain a uniform film thickness; nevertheless, they are capable of forming a thin film over a wide area within a short time at a relatively uniform thickness and therefore are suitable for mass production of industrial products. With the thermal decomposition methods, generally, the higher the temperature of the reaction system is, the faster the film deposition rate, although the situations vary somewhat depending on the compositional components of the raw materials for the thin film. Accordingly, it seems that higher temperatures are preferable for the formation of a thin film in industrial production processes.

With the background of recent energy issues and environmental issues, solar cells have attracted attention. There are various types of solar cells, and among them, thin film solar cells have been considered as the mainstream henceforth in terms of resource savings. A general configuration of thin film solar cell is as follows. The structure is that a transparent conductive film composed of tin oxide ($SnO_2$) or the like, a photoelectric conversion layer composed of a non-crystalline semiconductor such as amorphous silicon or amorphous silicon germanium, and a conductive film are stacked successively on a transparent substrate such as a glass sheet.

Solar cells constantly have been required to improve their photoelectric conversion efficiency, and various technologies have been developed and put into practical use for that purpose. A typical example is a technology for producing a so-called light trapping effect, in which the surface of a transparent conductive film is provided with surface roughness where incident light is scattered to lengthen the optical path length in the photoelectric conversion layer. Such surface roughness in the transparent conductive film is originated from crystal growth of tin oxide. In order to grow large crystal grains of tin oxide, it is effective to carry out a film deposition at high temperatures or to increase the thickness of the thin film. For example, JP 2862174 B describes an electrically-conductive film solar cell substrate that is formed by atmospheric-pressure chemical vapor deposition using $SnCl_4$, $H_2O$, $CH_3OH$, and HF as raw materials, with numerous protrusions on the surface.

In addition, in order to enhance the photoelectric conversion efficiency of a solar cell, it is essential to increase the amount of light incident on the photoelectric conversion layer, and there have been developed a technology for reducing the reflectance for incident light and a technology for reducing the absorptance in the transparent conductive film. For example, JP 2001-35262 A proposes a thin film made of a tin oxide in which the absorption coefficient is suppressed to be low within such a wavelength range that a solar cell can utilize effectively.

In the above-noted thermal decomposition methods, however, the formation of the thin film virtually denotes crystal growth in the case where the metal oxide is crystalline; therefore, the conditions of the crystal growth in the thin film change considerably depending on the conditions of the surface of the substrate or the like on which the thin film is formed. Specifically, if what serves as starting points for crystal growth exists in large numbers on the surface of a substrate on which the thin film is formed, crystal growth starts from numerous points, and consequently, the crystal growth, that is, the thickness of the thin film, becomes relatively uniform. On the other hand, if what serves as starting points for the crystal growth exists in fewer numbers on that surface, each one of the crystals grows large before the formation of crystal nuclei in the case of a raw material with faster reactivity being used, and a variation in film thickness therefore becomes large. Moreover, crystals become more difficult to grow, slowing down the film deposition rate. In turn, if the formation temperature of the thin film is increased to complement the slowing down of the film deposition rate, the variation in film thickness becomes even larger.

For example, an example in JP 2(1990)-175631 A describes that a tin oxide thin film is formed at a glass temperature of 580° C. using tin tetrachloride. When a tin oxide thin film is formed under this condition, no problem arises in terms of the performance of the thin film except that the film deposition rate is slow; however, a further experiment performed by the present inventors proved that when the thin film was formed with the glass temperature elevated to 615° C., the glass surface was observed to have a white turbidity. When the portion with the white turbid condition was observed with an electron microscope, giant crystal grains that were as large as 2 μm in diameter was observed, together with the adjacent portions in which crystal grains are absent. This seems to be because, before crystal nuclei were formed uniformly on the glass surface, initially-formed nuclei had grown abruptly, forming a large unevenness on the glass surface, and thus, when macroscopically seen, the haze ratio (haze factor) considerably increased.

Further, Example 25 in JP 9(1997)-40442 A describes that, with a manufacturing process for a glass sheet using a float process, an undercoating film made of silicon oxide was deposited on a glass ribbon using a CVD method, and subsequently a thin film made of tin oxide was formed at a film deposition rate of 6234 nm/min. However, since an undercoating film made of silicon oxide has a very smooth surface, it is obvious that when a thin film made of tin oxide is deposited at a film deposition rate of as fast as 6234 nm/min. without performing any treatment thereto, giant crystal grains should form, causing a white turbidity. In this regard, JP 9(1997)-40442 A contains no description concerning the surface condition of the glass substrate of Example 25.

On the other hand, in JP 2862174 B, in which its object is to further grow crystal grains of tin oxide using tin chloride as a raw material and to increase the film deposition rate to improve productivity, a transparent conductive film with a thickness of 350 nm or greater is deposited by a thermal decomposition method on a surface of a glass substrate the temperature of which is higher than 615° C. When a film deposition is carried out at such a high temperature, crystal grains are not uniformly formed in the surface, resulting in a white, turbid transparent conductive film with a very high haze ratio. There has been a problem that if a photoelectric conversion device is constructed by an amorphous silicon layer formed on this transparent conductive film, the amorphous silicon film, which serves as the photoelectric conversion layer, is not uniformly formed, and the efficiency of the solar cell is reduced.

Furthermore, there has been a problem when dimethyltin dichloride or monobutyltin trichloride is used as tin materials other than those described above, in that although the white turbidity does not occur, the absorptance becomes large in the wavelength range of 400 to 700 nm, in which the light quantity of solar light spectrum reaching the Earth's ground is large, particularly in the short wavelength range thereof, and as a result, the incident light volume on the photoelectric conversion layer in the solar cell is small. For example, JP 2001-35262 A describes absorption coefficients of the tin oxide films using dimethyltin dichloride or monobutyltin trichloride as a raw material; the absorption coefficient thereof is lowest at a wavelength of about 600 to 700 nm, and the absorption coefficient at 400 nm is 1.8 times or greater than that of the foregoing range.

DISCLOSURE OF THE INVENTION

This invention has been accomplished taking the foregoing problems into consideration. An object thereof is to provide a thin film-forming method by which, when a thin film containing a crystalline metal oxide as the main component is formed utilizing a thermal decomposition method within a short time over a wide area, the thickness of the thin film becomes relatively uniform. Another object thereof is to prevent a white turbidity in a substrate provided with the thin film containing a crystalline metal oxide as the main component, as well as to prevent the formation of defect points in a functional film that is to be formed on the thin film. A still further object is to provide a substrate provided with a transparent conductive film that comprises a bump and depression configuration that exhibits a light trapping effect effectively and that shows less absorption of a short wavelength range of visible light, when this thin film containing a crystalline metal oxide as the main component is used as a transparent conductive film for a photoelectric conversion device or the like, in order to increase the incident light volume to the photoelectric conversion layer. Yet another object thereof is to provide a photoelectric conversion device using the substrate.

In order to accomplish the foregoing objects, a thin-film forming method according to this invention is characterized by forming, after disposing metal-containing particles on a substrate, forming a thin film containing a crystalline metal oxide as a main component by a thermal decomposition method using a chloride of a metal as a raw material.

Alternatively, the method is for forming on a substrate a thin film containing a crystalline metal oxide as the main component by a thermal decomposition method using a chloride of a metal as a raw material, characterized in that the film deposition rate for a metal-containing thin film is slower than the film deposition rate for the thin film containing a crystalline metal oxide as the main component, and the thin film containing the metal oxide as main component is directly deposited on the metal-containing thin film. The use of these thin film-forming methods makes it possible, even when the thin film containing a crystalline metal oxide as the main component is formed at a high film deposition rate by a thermal decomposition method using a chloride of a metal as a raw material, to suppress the generation of giant crystal grains of the metal oxide.

In another aspect, a substrate according to this invention comprises a buffer layer having a film thickness of 250 nm or less and a transparent conductive film deposited in that order by a thermal decomposition method using a tin chloride as a raw material. This substrate has the transparent conductive film provided with relatively large and uniform surface roughness and therefore is capable of scattering transmitted light and reflected light efficiently at the surface. Therefore, when this substrate is used for a photoelectric conversion device, the conversion efficiency of the photoelectric conversion device can be increased without causing defect points such as pinholes in the photoelectric conversion layer.

PREFERRED EMBODIMENTS OF THE INVENTION

Figure 1:
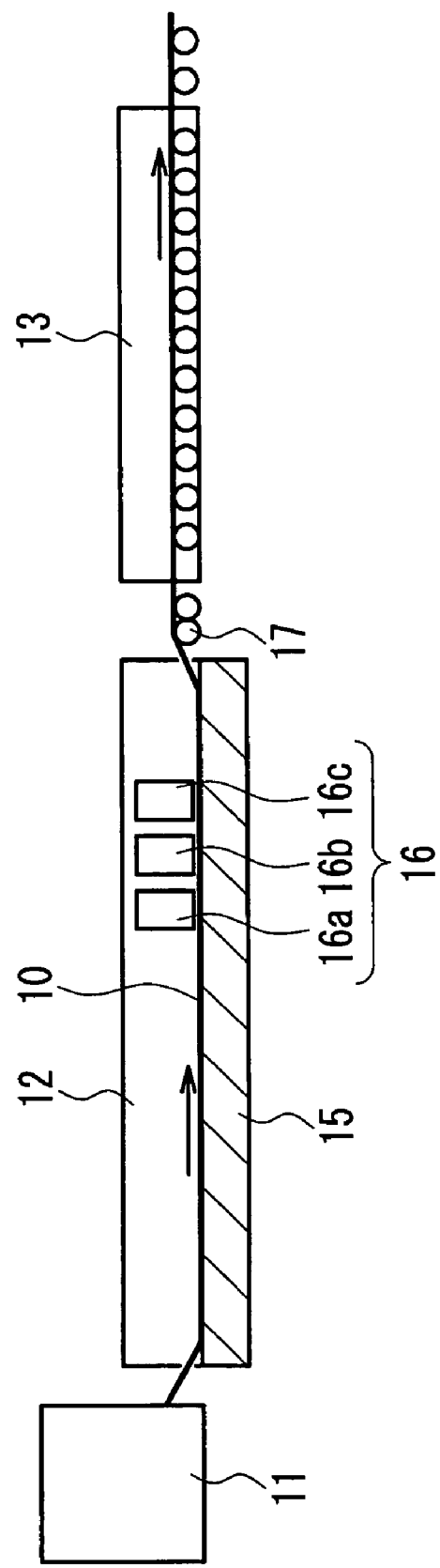
FIG. 1 is a schematic view of an apparatus used for an online CVD method.

Hereinbelow, preferred embodiments of this invention are described in detail. It should be noted that the invention is not intended to be limited by the following preferred embodiments.

A thin film-forming method according to this invention is a method of forming a thin film containing a crystalline metal oxide as a main component on a substrate, using a thermal decomposition method, including: forming the thin film using a raw material containing a chloride of a metal; and prior to the forming of the thin film, 1) disposing metal-containing particles on the substrate, or 2) forming, at a film deposition rate slower than a film deposition rate for the thin film, a metal-containing thin film on the substrate, wherein, in the case of the step 2), the thin film containing the metal oxide as main component is directly formed on the metal-containing thin film.

Herein, the term "metal-containing particle" is intended to mean a body that contains a metal, such as silicon, zinc, zirconium, indium, tin, or titanium, the particle diameter of which is in a range of nanometers to submicrons. The metal-containing particle may be any of nitride, oxide, oxynitride, and complex, and the configuration thereof is not particularly limited. The term "metal-containing thin film" denotes a thin film that is deposited by a thermal decomposition method using a chloride of a metal as a raw material and in which a metal exists as its film substance. The metal existing as the film substance may be the above-mentioned metal-containing particle or may be what is encompassed as a compositional component of the thin film. The term "thin film containing a crystalline metal oxide as the main component" denotes, literally, those which have a crystalline metal oxide such as tin oxide, titanium oxide, zinc oxide, tin indium oxide doped with tin (ITO), and cadmium oxides as the main component.

Herein, the term "main component" denotes, according to convention, a component whose content is 50 mass % or greater among the compositional components. The characteristics of a thin film are mostly determined by its main component, and therefore, it will be appropriate to assess the characteristics of the thin film with the main component. Also, the term "transparent conductive film" denotes a thin film that is encompassed by the thin film containing a crystalline metal oxide as the main component, which has a crystalline metal oxide, such as tin oxide, zinc oxide, ITO, and cadmium oxide, as the main component and has both a light-transmissive property and a conductive property.

The present inventors have conducted intensive studies focusing on the fact that the condition of crystal growth in a thin film containing a crystalline metal oxide as the main component changes depending on the surface conditions of the substrate, and as a result have found that crystal growth of a metal oxide in the thin film containing a crystalline metal oxide as the main component can be made relatively uniform by allowing a substance that can be starting points for crystal growth to be present on the substrate in advance of forming the thin film containing a crystalline metal oxide as the main component. The substance that can be starting points for crystal growth is the metal-containing particle or metal-containing thin film, which have been mentioned above.

Because of the presence of these, the starting points for crystal growth of metal oxide increase greatly in number and the crystal growth starts almost simultaneously from numerous positions; therefore, the generation of giant crystal grains is suppressed in the formation of the thin film, and as a result, the thickness of the thin film becomes relatively uniform. Thus, the metal-containing particles or metal-containing thin film disposed on a substrate serves the function of suppressing the generation of giant crystal grains in the formation of the thin film, and for this reason, these may also be collectively referred to as "buffer layer" hereinafter.

Generally, with a thin film containing a crystalline metal oxide as the main component, as the temperature of its formation becomes higher, the crystal growth rate, i.e., the film deposition rate becomes faster; accordingly, from the viewpoint of industrial production efficiency, higher temperatures of formation are more preferable. This, however, causes the thickness to be considerably non-uniform, leading to problems in appearance such as the white turbidity in the case of the substrate being transparent, or problems in terms of performance such as the generation of particle-like defect points, which are called pinholes, in the case of forming a functional film thereon. On the other hand, reducing the formation temperature of the thin film containing a crystalline metal oxide as the main component has an advantage in that the film thickness becomes relatively uniform, although the film deposition rate becomes slower. Accordingly, it will be appreciated that if one can find a way to combine the advantage in the case of high formation temperatures and the advantage in the case of low formation temperatures, it is possible to make the film thickness of a thin film containing a crystalline metal oxide as the main component relatively uniform while keeping the film deposition rate high. The present inventors have made intensive studies on this and as a result have reached this invention. This invention makes it possible to suppress the generation of the pinholes and effectively prevent the area with a white, turbid condition from expanding in cases where the film deposition rate for a thin film containing a crystalline metal oxide as the main component is fast, particularly in cases where the temperature of the reaction system is high.

The metal-containing particles exist on the substrate, forming bumps and functioning as starting points for crystal growth. The metal-containing thin film functions as starting points for crystal growth because it has bumps originating from the particles on the thin film surface in cases where it contains the metal-containing particles, and because the metal contained as a constituent component of the thin film attracts crystalline metal oxide and promotes crystal growth in cases where it does not contain the particles.

Regarding the metal-containing particles, it is preferable that their average particle diameter be 5 to 500 nm in order that they function as nuclei for crystal growth and at the same time suppress the formation of giant crystal grains in the formation of the thin film containing a crystalline metal oxide as the main component. The method for providing the metal-containing particles on a substrate is not particularly limited, but a preferable method is such that they are fixed to a substrate heated at a high temperature by a powder spraying method, in order that they can be disposed uniformly over the substrate and not be overlaid on one another. It is desirable that the metal-containing particles form a single layer and have a closest packed structure on the substrate; however, since they meet the purpose as long as they function as the nuclei for crystal growth, there may be slight gaps between the particles. When the gap between the particles is 100 μm or less, the particles can contribute to uniformity in the thin film containing a crystalline metal oxide as the main component.

The metal of the metal-containing particles or the metal of the metal-containing thin film may be different from the metal of the thin film containing a crystalline metal oxide as the main component, but it is preferable that they are the same type of metal. When they are the same type of metal, crystal growth is induced more in the thin film, and therefore, the metal-containing particles can be made small in the particle diameter thereof or fewer in number, or the content of the metal can be reduced in the metal-containing thin film. For example, when a thin film composed of tin oxide or titanium oxide that has a rutile structure is formed as the metal-containing thin film, it is desirable to deposit a film composed of tin oxide or titanium oxide with the same rutile structure, or a film composed of titanium oxide with an anatase structure, which is similar to the rutile structure, as the thin film containing a crystalline metal oxide as the main component.

The buffer layer may be formed directly on the substrate, or alternatively, an undercoating film may be formed on the substrate and the buffer layer may be formed thereon. The undercoating film is provided for, for example when the substrate is glass, preventing an alkaline component contained in the glass from thermally diffusing in the buffer layer or the thin film containing a crystalline metal oxide as the main component. The undercoating film may be a closely-packed thin film containing silicon oxide, aluminum oxide, silicon oxynitride, silicon oxycarbide, or the like as the main component, or when the adhesive force between the substrate and the buffer layer is low, the film may be such that it contains both of the components of the substrate and the buffer layer to increase the adhesive force by means of their affinity. Because of the presence of the undercoating film, the buffer layer or the thin film containing a crystalline metal oxide as the main component can be adhered to the substrate with sufficient strength, and its characteristics do not easily degrade.

Further, the undercoating film may either be a single layer or be composed of two layers. For example, the formation of an undercoating film comprising a first undercoating layer (substrate side) having a refractive index of 1.6 to 2.5 and a thickness of 5 to 100 nm and a second undercoating layer (buffer layer side) having a refractive index 1.4 to 2.0 and a film of 5 to 100 nm between the substrate and the buffer layer can reduce the reflectivity therebetween. Accordingly, by utilizing a light-transmissive conductive substrate that is provided with this undercoating film for a photoelectric conversion device, the amount of light incident on the photoelectric conversion layer can be increased. In addition to serving to reduce reflectivity and reflected interference colors, this undercoating film also serves, in cases where the substrate is a glass sheet containing an alkaline component, to prevent the alkaline component from diffusing into the buffer layer and the thin film containing a crystalline metal oxide as the main component and reducing their conductivity.

The first undercoating layer, which is in contact with the substrate, preferably should have as its main component at least one kind selected from the group consisting of tin oxide, titanium oxide, zinc oxide, and aluminum oxide. The second undercoating layer, which is in contact with the buffer layer, preferably should have as its main component at least one kind selected from the group consisting of silicon oxide, aluminum oxide, silicon oxynitride, silicon oxycarbide, and tin oxide. If the undercoating film is too thin, the above-described function of preventing the alkaline component from diffusing cannot be exhibited sufficiently. On the other hand, if it is too thick, the effect of reducing reflectivity is lost, and the transmissivity also reduces.

In addition, in cases where the first undercoating layer is a crystalline thin film containing tin oxide or titanium oxide as the main component, the surface roughness originated from crystal growth can be made larger by increasing the thickness thereof. The surface roughness of the first undercoating layer reflects the surface of the second undercoating layer; therefore, when the first undercoating layer is made fairly thick, 40 to 100 nm, and at the same time the closely-packed, non-crystalline second undercoating layer is made fairly thin, 5 to 50 nm, it is possible to make the surface roughness of the undercoating film greater and to further prevent the alkaline component contained in the glass sheet from diffusing into the buffer layer and the thin film containing a crystalline metal oxide as the main component in a reliable manner.

Further, in cases where the substrate is a glass sheet containing an alkaline component, by using a raw material containing a halogen, bumps or depressions that are larger than the surface roughness originated from crystal growth can be formed on the surface first undercoating layer in the formation of the first undercoating layer by a thermal decomposition method. Regarding such relatively large bumps or depressions, the alkaline component in the glass sheet and the halogen contained in the raw material for the first undercoating layer react with each other, forming alkali-halogen particles, which are taken into the first undercoating layer, forming bumps, or disappear therefrom due to heat, forming depressions. These bumps and depressions are reflected in the surface shape of the second undercoating layer. Accordingly, if the first undercoating layer that is crystalline and the second undercoating layer that is non-crystalline are formed by a thermal decomposition method, it is possible to reflect the surface roughness originating from the crystal growth and the above-noted bumps or depressions in the surface shape of the undercoating film. This is tantamount to being capable of processing the surface of the undercoating film to be in a non-flat state, and for this reason, if the above-described undercoating film is formed by a thermal decomposition method, the film deposition rate for the buffer layer can be quickened, as described above.

It should be noted that the phrase "the surface of the undercoating film is non-flat" denotes a state that is clearly distinguished from the case in which a non-crystalline undercoating film is formed directly on a glass sheet, and specifically, it means that the surface of the undercoating film has a level difference of 1 nm or larger.

On the other hand, even if the substrate was glass, the undercoating film is not necessarily required when the substrate is aluminosilicate glass, borosilicate glass, quartz glass, or the like, which does not contain alkaline components. Nevertheless, there are cases in which the undercoating film is necessary for other purposes than preventing an alkaline component from diffusing, as described above, and it should not be interpreted as excluding the provision of the undercoating film on a glass that does not contain alkaline components.

Those glasses that do not contain alkaline components have higher thermal characteristics, such as glass transition temperature, than a soda lime glass, which contains an alkaline component, and therefore are capable of forming a thin film containing a crystalline metal oxide as the main component at higher temperatures. Moreover, glass is non-crystalline and therefore the surface thereof is flat and smooth; likewise, the undercoating film that has silicon oxide as the main component is also non-crystalline and therefore the surface is flat and smooth. Since there exist no bumps that serve as starting points for crystal growth on such a flat and smooth surface, it is necessary to provide starting points for crystal growth by disposing the metal-containing particles or forming the metal-containing thin film thereon. Accordingly, this invention exhibits its advantageous effects particularly effectively in the case of forming the thin film containing a crystalline metal oxide as the main component on a glass substrate that does not contain alkaline components or on the non-crystalline undercoating film thereabove.

The method for forming the metal-containing thin film is not particularly limited as long as it is a thermal decomposition method, and examples include a CVD method and a solution-spraying method in which a solution material is sprayed onto a heated substrate. If the metal-containing thin film and the thin film containing a crystalline metal oxide as the main component are formed by the same formation method, they can be formed within a short time through a series of manufacturing steps; for this reason, it is preferable that these be formed by the same method in terms of industrial production efficiency.

Because the metal-containing thin film needs to function as starting points for crystal growth in the thin film containing a crystalline metal oxide as the main component, it is necessary that the film be formed uniformly on the surface of the substrate or of the undercoating film, desirably with bumps at constant intervals on the surface. For that reason, the film deposition rate for the metal-containing thin film is slower than the film deposition rate for the thin film containing a crystalline metal oxide as the main component. Specifically, the film deposition rate should preferably be 20 to 2500 nm/min. Nevertheless, in the case of the film deposition rate exceeding 600 nm/min., it is preferable that the surface of the undercoating film (second undercoating layer) be provided with bumps and depressions. Even if the film deposition rate for the metal-containing thin film itself is slow, the thickness thereof is 250 nm or less, as will be described later, and significantly thinner than that of the thin film containing a crystalline metal oxide as the main component (transparent conductive film); therefore, the film deposition rate as a whole, which includes that for the thin film containing a crystalline metal oxide as the main component, is not degraded considerably. Rather, because of the presence of the metal-containing thin film, the film deposition rate for the thin film containing a crystalline metal oxide as the main component can be made faster; therefore, if the metal-containing thin film is formed to be relatively thin and in addition the thin film containing a crystalline metal oxide as the main component is formed more quickly at a higher temperature, the film deposition rate as a whole can be made faster.

Examples of the means to make the film deposition rate for the metal-containing thin film slower than the film deposition rate for the thin film containing a crystalline metal oxide as the main component include a means in which the surface temperature of the substrate or the undercoating film is set to be fairly low in forming the metal-containing thin film and thereafter, after reheating, the thin film containing a crystalline metal oxide as the main component is formed, and a means in which a raw material with low reactivity is used. Nevertheless, in cases where, the undercoating film, the metal-containing thin film, and the thin film containing a crystalline metal oxide as the main component are formed successively on a glass ribbon in a float process by a CVD method, the temperature of reaction system during the formation of the metal-containing thin film form becomes higher than the temperature of reaction system during the deposition of the thin film containing a crystalline metal oxide as the main component. In this case, it is conceivable to reheat the glass ribbon using a burner or the like after the formation of the metal-containing thin film in order to make the temperature of reaction system for the thin film containing a crystalline metal oxide as the main component higher, but by doing so, temperature unevenness may occur in the glass ribbon, leading to the risk of degrading the formability of glass. In view of this case, it is desirable to reduce reactivity by varying the types of raw materials, or to lower the film deposition rate by reducing the thickness of the metal-containing thin film. For the chloride of a metal, those which do not contain organic substances, such as tin dichloride, tin tetrachloride, titanium chloride, zinc chloride, and indium chloride, are suitable for the purpose of reducing the environmental load.

The metal-containing thin films may be those including metal-containing particles, or those that contain a metal as its compositional component. For example, when a metal-containing thin film that has a crystalline metal oxide such as tin oxide or titanium oxide as the main component is formed by a CVD method, bumps that can be clearly distinguished from the other portion may be formed on the thin film in some cases, but in other cases, very small bumps and depressions are formed on the surface and the vertices of those bumps and depressions need to be interpreted as the bumps. In other words, a surface shape of a metal-containing thin film may not be determined easily if it is part of surface roughness or can be considered as a bump. In this invention, it is sufficient that the metal-containing thin film functions as starting points for crystal growth, and even if it cannot be distinguished clearly whether a shape forms a vertex of the surface roughness or a bump, that is not a problem per se as long as the foregoing function is fulfilled. Additionally, even if the metal-containing thin film does not have clearly-distinguishable bumps formed on the surface thereof, the function as the starting points for crystal growth can be fulfilled when crystal growth can be induced in the thin film containing a crystalline metal oxide as the main component.

For reference, it has been confirmed that in the case of forming the metal-containing thin film by a CVD method, white turbidity is not produced in the thin film containing a crystalline metal oxide as the main component even with increased film deposition rates for the metal-containing thin film and increased film thicknesses when the concentration of a metal-containing gas in the mixed gas, which serves as the raw material therefor, is lowered. This seems to be because the lowering of the concentration of the metal-containing gas suppresses abrupt crystal growth that originates from the high concentration metal-containing gas residing locally.

The metal-containing thin film should preferably be in a condition such that the thickness is 10 to 250 nm, and the surface thereof has a multiplicity of bumps formed thereon and having a height of 10 to 200 nm. When the thickness is less than 10 nm, there is a risk of the undercoating film being not completely covered; on the other hand, when exceeding 250 nm, the bumps become too large and too high, the risk of generating giant crystal grains in the thin film containing a crystalline metal oxide as the main component increases. The more preferable thickness of the metal-containing thin film is 30 to 200 nm.

After forming the buffer layer with the above-mentioned means, the thin film containing a crystalline metal oxide as the main component is formed using a thermal decomposition method. Due to the presence of the buffer layer, the thin film containing a crystalline metal oxide as the main component does not easily cause variations in film thickness because the crystal growth starts to take place from numerous starting points. Therefore, the thin film-forming method according to this invention makes it possible to form a defect-free, high quality thin film containing a crystalline metal oxide as the main component with increased production efficiency because giant crystal grains are not generated even when the film deposition rate for the thin film containing a crystalline metal oxide as the main component is made faster.

The chloride of a metal that is a raw material for the thin film containing a crystalline metal oxide as the main component should preferably be in a gaseous state in the vicinity of the substrate. Accordingly, it may be in a liquid state on the way in which it is supplied to the vicinity of the substrate. That is, although a CVD method, in which the medium containing the chloride of a metal is supplied in a gaseous state, is desirable, it is also possible to employ a solution-spraying method, in which it is liquid on the way, or a powder spraying method, in which it is in a solid state. In a CVD method, it is preferable that the respective raw materials be separately supplied through separate lines so that the chloride of a metal in a gaseous state reacts with an oxidizing material or the like in the vicinity of the substrate. On the other hand, in cases where the raw materials are pre-mixed halfway on the supply line, a white turbid, high-haze condition tends to occur in a wide area of the thin film containing a crystalline metal oxide as the main component at low formation temperatures. This is because, with the pre-mixing, the raw materials in a gaseous state bring about a reaction before they reach the vicinity of the substrate, making them more liable to generate giant crystal grains in cases where there are fewer starting points for crystal growth on the substrate. Therefore, this invention exhibits its advantageous effects more effectively in the case of pre-mixing the raw materials.

Although the method for forming the thin film containing a crystalline metal oxide as the main component is not particularly limited as long as it is a thermal decomposition method, a method in which the arranging of the metal-containing particles or the formation of the metal-containing thin film can be performed in a serious of steps is preferable. An example is a method in which the metal-containing thin film is formed using a CVD method and thereafter the thin film containing a crystalline metal oxide as the main component is formed successively. In this case, however, since the formation temperature for the thin film containing a crystalline metal oxide as the main component becomes lower than that for the formation of the metal-containing thin film form, it is desirable to utilize a material with good reactivity, such as tetrachloride, for the raw material of the thin film containing a crystalline metal oxide as the main component. Moreover, when water vapor is used as the main raw material for the oxidizing material and oxygen is eliminated, it becomes possible to promote decomposition of the chloride of a metal and increase the film deposition rate.

It should be noted that in cases where the thin film containing a crystalline metal oxide as the main component is formed over a plurality of times, for example, in cases where, with a CVD method, the film is deposited gradually using a plurality of coaters, the advantageous effects of this invention can be exhibited if the film deposition rate with the raw material supplied from any one of the coaters is faster than the film deposition rate for the metal-containing thin film.

The formation of the thin film containing a crystalline metal oxide as the main component may be carried out by a method in which, in the case where the substrate is a glass sheet, molten glass is first formed and cut into a desirable size, and thereafter the cut pieces are heated at a high temperature of higher than 615° C. to form the film by a thermal decomposition method. In addition, it is possible to adopt a method in which, in a glass sheet manufacturing process with a float process, the above-mentioned various raw materials are applied onto the surface of a glass ribbon in a float bath to form the film by a thermal decomposition method utilizing the heat retained by the glass ribbon (hereafter, the method is referred to as "online CVD method"). In the online CVD method, since the temperature of the glass ribbon is even higher, the advantageous effects of this invention are exhibited more effectively. In an examination performed by the present inventors, it was confirmed that when the thin film containing a crystalline metal oxide as the main component is formed without the buffer layer, the area with the white turbid condition widens as the temperature of the substrate, such as the cut glass or the glass ribbon, increases. In other words, the advantageous effects of the buffer layer becomes greater when the temperature of the transparent substrate or the undercoating film is higher.

When a buffer layer is formed on the substrate, the film deposition rate for the thin film containing a crystalline metal oxide as the main component can be increased to 2700 nm/min. or higher, or even to 3500 nm/min. or higher. In particular, when the undercoating film, the metal-containing thin film, and the thin film containing a crystalline metal oxide as the main component are formed in that order using the online CVD method, the temperature of the reaction system in the formation of the thin film containing a crystalline metal oxide as the main component (the surface temperature of the glass ribbon immediately therebefore) can be elevated to 615° C. or higher, or even to a range of 620° C. to 750° C. For example, when the above-noted surface temperature is 650° C. or higher, the film deposition rate reaches as high as 6300 to 20000 nm/min. Nevertheless, even when the thin film containing a crystalline metal oxide as the main component is formed at such fast film deposition rates, this glass substrate does not produce a white turbidity as long as the buffer layer is formed.

As raw materials for the metal-containing thin film and the thin film containing a crystalline metal oxide as the main component that are used in the thermal decomposition method, it is preferable to use chlorides of tin and titanium. Examples of tin materials include tin tetrachloride, dimethyltin dichloride, dibutyltin dichloride, tetramethyltin, tetrabutyltin, dioctyltin dichloride, monobutyltin trichloride, and dibutyltin diacetate, and in particular, the above-described advantageous effects are exhibited effectively when tin tetrachloride is a raw material. Examples of the oxidizing material used for forming tin oxide from the tin materials include water vapor, oxygen, air, alcohols such as methyl alcohol and ethyl alcohol. For reference, by using water vapor and oxygen in combination or by increasing the concentration of water vapor, the absorption coefficient of the thin film containing a crystalline metal oxide as the main component in the wavelength range of 600 to 800 nm can be reduced. In the case of using water vapor and oxygen in combination, the concentration of water vapor should preferably be 30 to 70 mol/L and the concentration of oxygen 5 to 30 mol/L, whereas in the case of using only water vapor, its suitable concentration is 40 to 95 mol/L. When a transparent conductive film containing tin oxide as the main component is deposited as the thin film containing a crystalline metal oxide as the main component, it is preferable to add a compound of antimony or fluorine thereto in order to improve its conductivity. Examples of the compound of antimony include antimony trichloride and antimony pentachloride, and examples of the fluorine compound include hydrogen fluoride, trifluoroacetic acid, bromotrifluoromethane, and chlorodifluoromethane. In order to enhance the conductivity further, these should preferably be used in combination. A preferable fluorine concentration in the transparent conductive film is 0.2 mass % or less. In this case, the refractive index of the transparent conductive film is about 1.9.

In the case of forming the undercoating film by a thermal decomposition method, examples of raw materials for silicon oxide suitable as the undercoating film include monosilane, disilane, trisilane, monochlorosilane, dichlorosilane, 1,2-dimethylsilane, 1,1,2-trimethyldisilane, 1,1,2,2-tetramethyldisilane, tetramethyl orthosilicate, and tetraethyl orthosilicate. Examples of the oxidizing materials in this case include oxygen, water vapor, dry air, carbon dioxide, carbon monoxide, nitrogen dioxide, and ozone. It should be noted that in the case of using silane, an unsaturated hydrocarbon gas, such as ethylene, acetylene, or toluene, may be used in combination for the purpose of preventing the silane from reacting before reaching the glass surface. Likewise, examples of raw materials for aluminum oxide suitable as the undercoating film include trimethylaluminum, aluminum triisopropoxide, diethylaluminum chloride, aluminum acetylacetonate, and aluminum chloride. Examples of the oxidizing materials in this case include oxygen, water vapor, and dry air.

Types and configurations of the substrate are not particularly limited. Those that have conventionally provided with a thin film containing a crystalline metal oxide as the main component may be used as they are. For example, when a thin film containing a crystalline metal oxide as the main component is formed on a transparent substrate such as glass, the haze ratio of the glass substrate reduces because giant crystal grains are not formed. Accordingly, glass products provided with the thin film containing a crystalline metal oxide as the main component can exhibit such functions originating from the thin film as the electro-magnetic-wave-shielding function, the heat-ray-reflecting function, and the electrical conducting function effectively without causing problems such as forming a white turbidity.

Hereinbelow, a preferred embodiment with an online CVD method is described in more detail. As illustrated in FIG. 1, in an apparatus used for the online CVD method, a glass ribbon 10 flows out from a melting furnace (float furnace) 11 into a float bath 12 and moves on a tin bath 15 in a belt-like form, and a predetermined number of coaters 16 (three coaters 16a, 16b, and 16c in the embodiment illustrated in the figure) that are spaced apart from the surface of the glass ribbon 10 are provided in the tin float bath. From these coaters, gaseous raw materials are supplied so that the undercoating film, the metal-containing thin film, and the thin film containing a crystalline metal oxide as the main component are successively formed on the glass ribbon 10. Although not shown in the figure, it is possible to adopt more coaters so that the undercoating film may have a two-layered configuration, or the thin film containing a crystalline metal oxide as the main component may be deposited by supplying raw materials from a plurality of coaters. The glass ribbon 10 on which the thin film containing a crystalline metal oxide as the main component is formed is pulled up by rollers 17 and is transferred to an annealing furnace 13. The glass ribbon that has been annealed in the annealing furnace 13 is cut into glass sheets having a predetermined size by a cutting device, which is not shown in the figure. For the formation of the thin film containing a crystalline metal oxide as the main component, it is possible to use a solution-spraying method, in which various raw materials are supplied in a liquid state onto the glass ribbon that has come out of the float bath 12, or a powder spraying method, in which the raw materials are supplied in a solid state, in combination with the CVD method in the float bath.

With the online CVD method as well, it is desirable that raw materials be transferred through separate lines in the coaters so that they mix in the vicinity of the glass ribbon, and this invention makes it possible to use them in a pre-mixed form. Using pre-mixed raw materials causes their reaction to start at an early stage in the coaters and thus tends to form giant crystal grains in the thin film containing a crystalline metal oxide as the main component. In fact, in conventional online CVD methods, a white turbidity has been caused with the surface temperature of the glass ribbon being at about 600° C. in the case of using tetrachloride as a chloride of a metal, if the raw materials used are pre-mixed. By contrast, according to this invention, even when pre-mix raw materials are supplied onto a glass ribbon the surface temperature of which is at 620 to 750° C., the glass does not cause a white turbidity. In addition, pre-mixing raw materials has many advantages in terms of industrial manufacturing process, such as temperature controls are made simple until they are supplied to the coaters.

Moreover, the present inventors found that, in the case of depositing a transparent conductive film containing tin oxide as the main component by a thermal decomposition method using tin chloride as a raw material, the transparent conductive film can be prevented from causing a high-haze state effectively by making the thickness of the buffer layer be 250 nm or less.

The thickness of the buffer layer should preferably be 10 nm or greater so that it can cover the entire surface of the substrate. If the thickness is less than 10 nm, it is difficult to cover the entire surface of the substrate. On the other hand, if it is too thick, the surface roughness of the buffer layer become too large, adversely affecting uniformity in the transparent conductive film. Accordingly, the thickness of the buffer layer needs to be 250 nm or less, or should more preferably be 150 nm or less.

For the transparent conductive film, it is desirable that the absorption coefficient thereof be $1 \times 10^3$ cm$^{-1}$ or less in the wavelength range of 400 to 700 nm, the maximum value of the absorption coefficient be 1.7 times or less the minimum value, and the sheet resistance be 15Ω/□ (square) or less, for use as a transparent conductive film for a solar cell. The wavelength range of 400 to 700 nm is a region in which the light quantity of the solar light spectrum that reaches the Earth's ground is large and therefore is considered as an important wavelength range in terms of increasing the photoelectric conversion efficiency in a solar cell. Reducing the absorption in the transparent conductive film within the entire wavelength range leads to an increase in the quantity of light that enters the photoelectric conversion layer. Research by the present inventors proved that, when a thin film composed of tin oxide was formed on a glass sheet using tin chloride at a high temperature, the absorption in the thin film composed of tin oxide was reduced in the wavelength range from 400 to 700 nm because unnecessary impurity components were not added. Since the transparent conductive film also serves as an electrode in a solar cell and therefore, it is preferable that the sheet resistance be lower; however, in conventional ones, reduction in the sheet resistance has led to an increase in the absorption in the long wavelength range due to the absorption by free electrons and to an increase in the short wavelength range as well. With a thin film-forming method according to this invention, in cases where a transparent conductive film containing tin oxide as the main component is deposited on a substrate using tin chloride at high temperatures, the absorption coefficient is $1 \times 10^3$ cm$^{-1}$ or lower in the wavelength range of 400 to 700 nm and the absorption coefficient can be reduced so that the maximum value is 1.7 times or less of the minimum value while the sheet resistance is kept at 15Ω/□ or lower. Note that, although details of the method for measuring light absorption coefficients of transparent conductive films will be given in Examples, the light absorption coefficient for that including the buffer layer is taken as the light absorption coefficient of the transparent conductive film for convenience in measurement.

In addition, by providing a surface roughness on the surface of the transparent conductive film as described above, the light-trapping effect is caused to occur, improving photoelectric conversion efficiency of photoelectric conversion devices represented by solar cells. As a means to provide a surface roughness, the thickness of the transparent conductive film conventionally has been increased. The transparent conductive film has tin oxide as the main component and accordingly is crystalline, so when the thickness is larger, individual crystals are larger and its surface roughness is greater. However, an increased thickness of the transparent conductive film causes the problem of absorption as described above. Thus, the transparent conductive film is required to be thin, and moreover, to have relatively large and uniform surface roughness. In order to deposit such a transparent conductive film, increasing the thickness of the buffer layer is effective. When the thickness of the buffer layer is increased, the surface roughness of the buffer layer can be made larger, and the transparent conductive film formed thereon is provided with the above-noted relatively large surface roughness as the starting points for crystal growth; therefore, it is possible to make the transparent conductive film be made thin and at the same time to make the surface roughness large. Nevertheless, when the surface roughness of the buffer layer become larger than are necessary, various problems arise, such that a white turbidity appears in the transparent conductive film as described above or that the film deposition rate as a whole, including that of the buffer layer, slows down even if the transparent conductive film can be deposited at high speed. For that reason, a larger thickness of the buffer layer is not necessarily desirable, and a suitable range of the thickness is restricted to a range in which the surface roughness of the transparent conductive film can be appropriately large. Specifically, the thickness of the buffer layer needs to be 250 nm or less; it should preferably be 100 to 200 nm, and most preferably be 140 to 150 nm.

Figure 2:
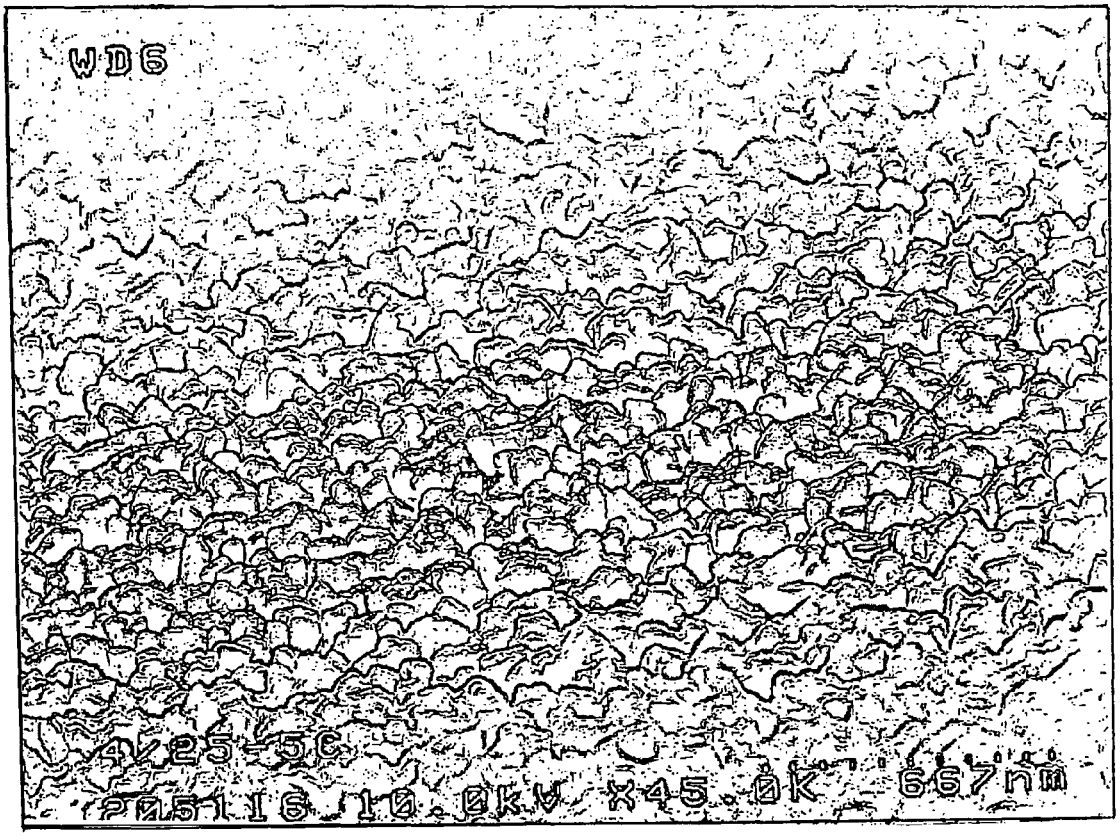
FIG. 2 is a photograph, image-processed into a black-and-white binary image, of a 90 nm-thick buffer layer photographed at a dip of 30° using a scanning electron microscope (SEM).
Figure 3:
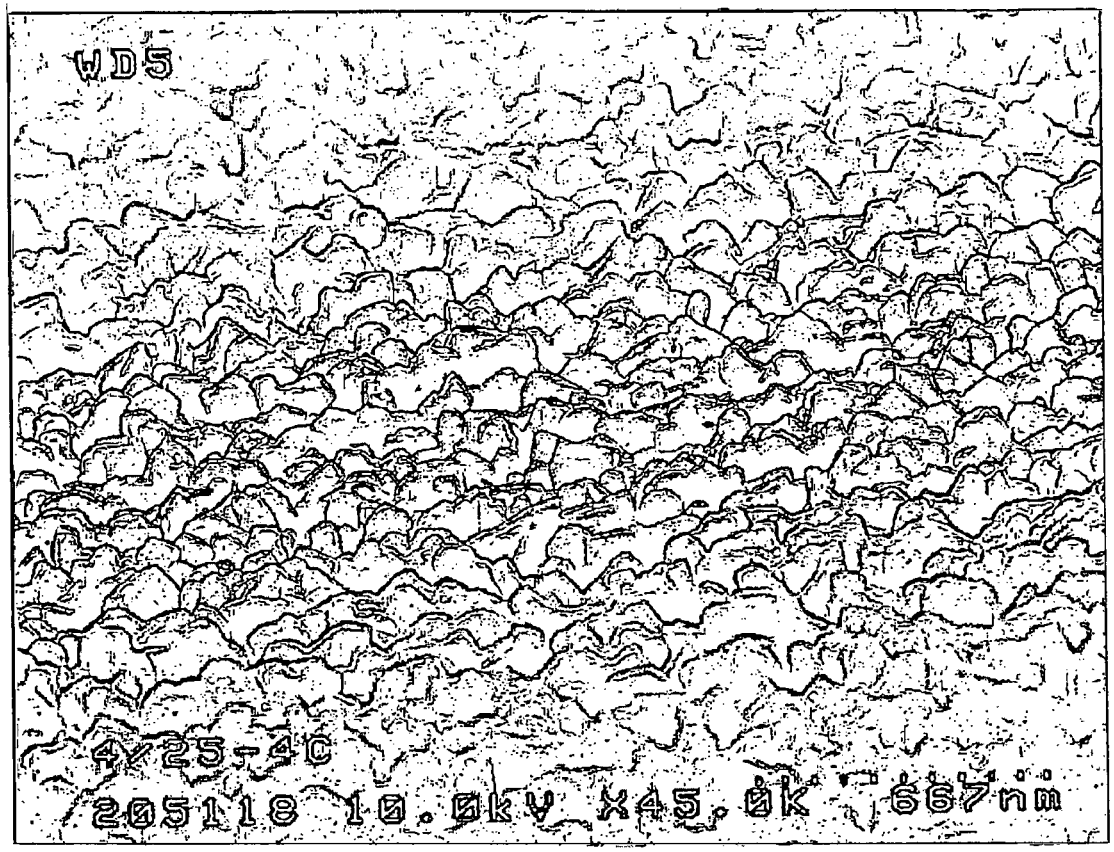
FIG. 3 is a photograph, image-processed into a black-and-white binary image, of a 140 nm-thick buffer layer photographed at a dip of 30° using a SEM.
Figure 4:
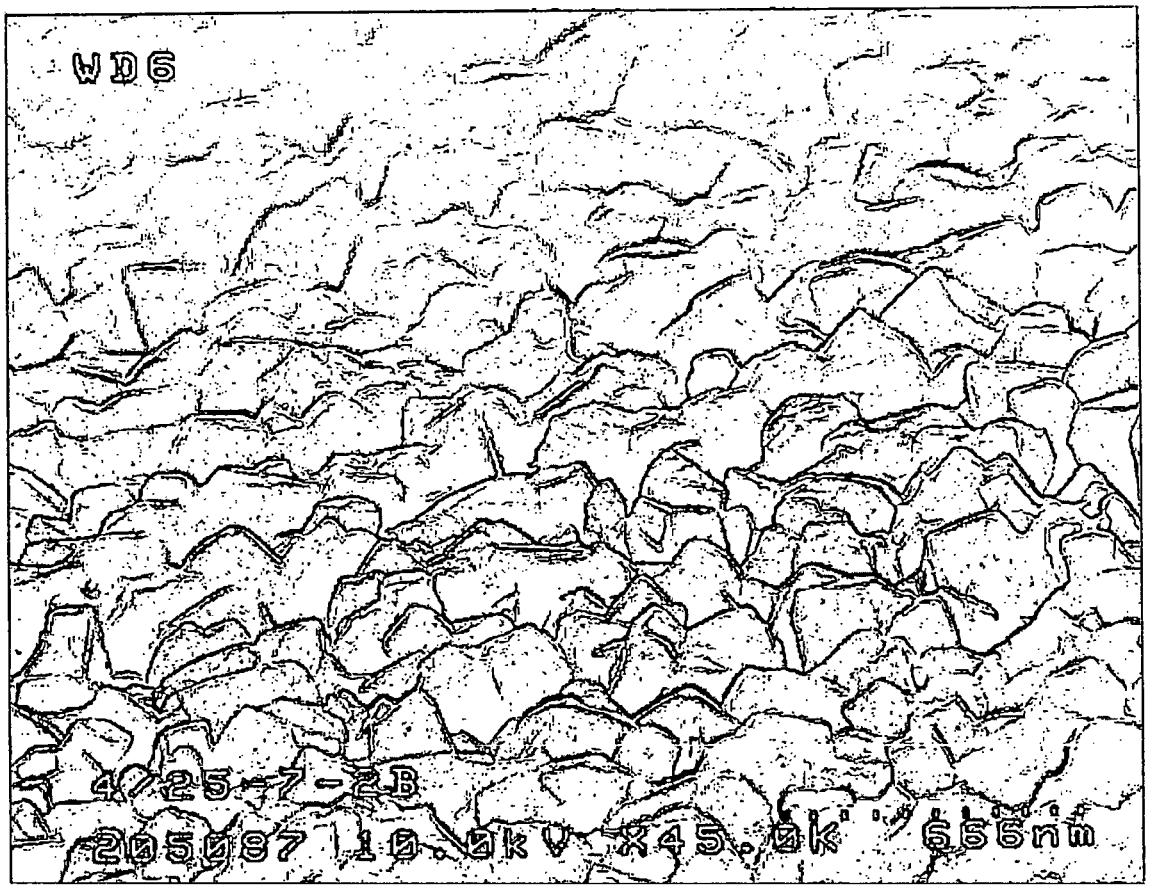
FIG. 4 is a photograph, image-processed into a black-and-white binary image, of a 190 nm-thick buffer layer photographed at a dip of 30° using a SEM.

In order to study the relationship between the thickness of the buffer layer and its surface roughness, a first undercoating layer composed of tin oxide, a second undercoating layer composed of silicon oxide, and a metal-containing thin film (buffer layer) having tin oxide as the main component are formed on a glass substrate in that order by a CVD method, with varied thicknesses of the buffer layer. For the samples thus obtained, the buffer layers were photographed at a dip of 30° with a scanning electron microscope (SEM). FIGS. 2 to 4 show the SEM photographs, image-processed into a black-and-white binary image. FIG. 2 shows the case of the buffer layer being 90 nm, FIG. 3 the case of the buffer layer being 140 nm, and FIG. 4 the case of the buffer layer being 190 nm; these have the same configuration except that the thickness of the buffer layer is varied. As clearly seen from the comparison between FIGS. 2 to 4, the thicker the buffer layer is, the larger the surface roughness is. The size of the surface roughness of the transparent conductive film formed on the buffer layer becomes larger approximately proportionately to the surface shape of the buffer layer.

The sheet resistance of the transparent conductive film, specifically, preferably should be 5 to 15Ω/□. The sheet resistance is measured using commercially available equipment that makes use of a four-probe method. For that reason, slight influences from the buffer layer or the undercoating film appear on the sheet resistance values. Taking the foregoing range of the sheet resistance value into account, the preferable film thickness of the transparent conductive film is from 500 to 2000 nm. Nevertheless, taking absorption for visible light as described above into account, the more preferable film thickness is 500 to 1000 nm. As will be described later in Examples, the substrate according to this invention makes it possible to increase the haze ratio as high as 12% or higher even when the thickness of transparent conductive film is 1000 nm or less.

It should be noted that the transparent conductive film may contain a trace amount of other components such as silicon, aluminum, zinc, copper, indium, bismuth, gallium, boron, vanadium, manganese, and zirconium. Nevertheless, the concentration of these trace-amount components should preferably be 0.02 mass % or less.

Figure 5:
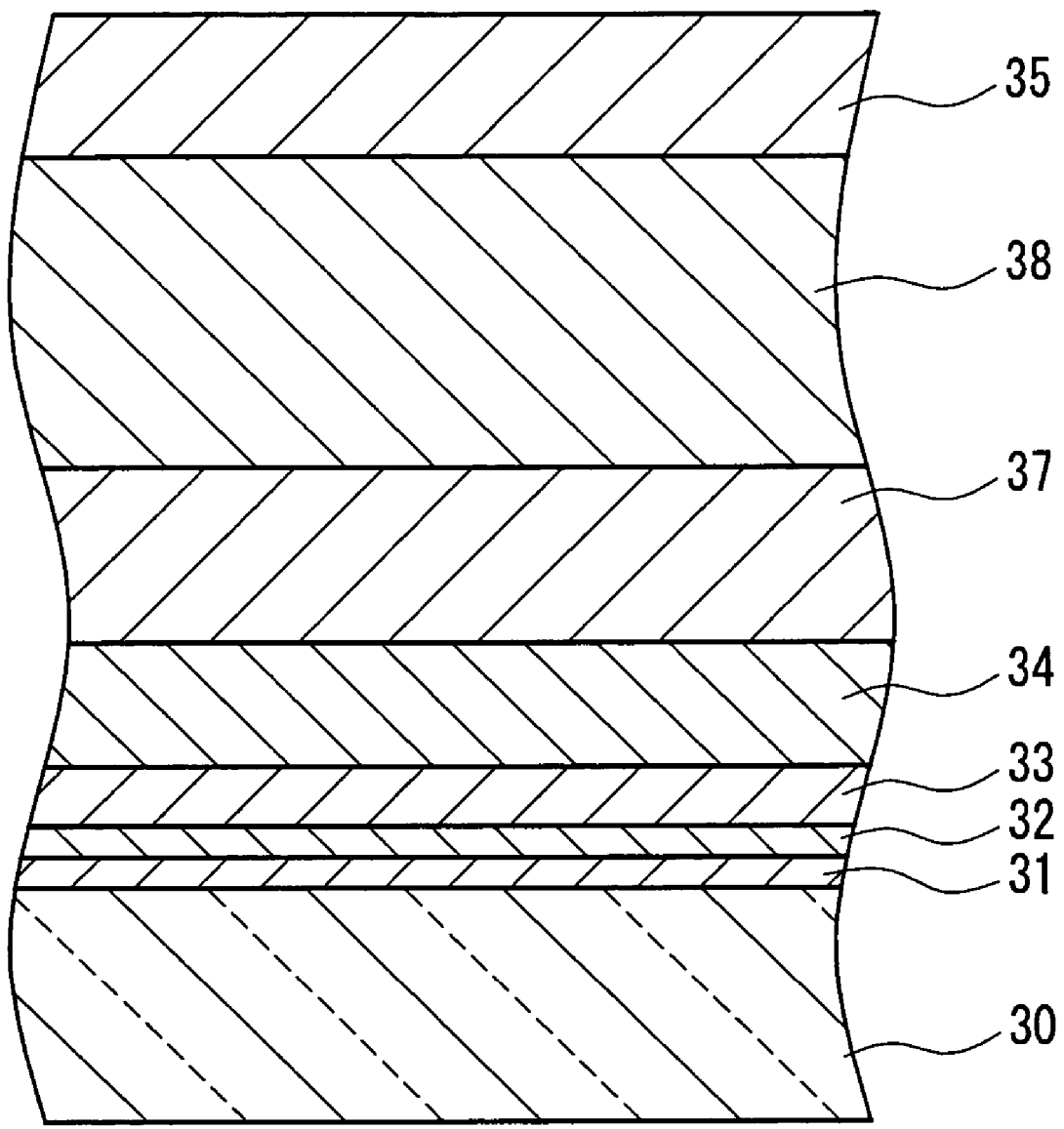
FIG. 5 is a cross-sectional view of one example of a photoelectric conversion device to which the present invention is applied.

Hereinbelow, the description discusses a case in which a substrate provided with the buffer layer and the transparent conductive film is utilized for a photoelectric conversion element. As illustrated in FIG. 5, a photoelectric conversion element is obtained by forming, on a substrate 30, undercoating films 31 and 32, a buffer layer 33, a transparent conductive film 34, photoelectric conversion layers 37 and 38 of thin films composed of amorphous silicon or crystalline silicon or similar films, and a conductive film (back electrode) 35 successively. A device in which the photoelectric conversion element is incorporated and various components are associated and assembled into an unit so that, for example, as a solar cell, electric energy can be taken out from light energy, is referred to as a photoelectric conversion device.

The photoelectric conversion layer may be a single layer configuration, or may have a configuration in which a plurality of layers are stacked. It may be a thin film composed of conventional amorphous silicon, or may be a thin film composed of crystalline silicon. Further, a thin film 37 composed of amorphous silicon and a thin film 38 composed of crystalline silicon are combined to form a so-called hybrid tandem type. In the case of hybrid tandem type, generally, a thin film composed of amorphous silicon is formed on the transparent conductive film, and a thin film composed of crystalline silicon is formed thereover.

The thin film composed of amorphous silicon is formed by depositing p-, i-, and n-type semiconductor layers in that order by a plasma CVD method. Specifically, examples include a film in which the following layers are deposited in that order: a p-type microcrystalline silicon-based layer doped with boron atoms, which are conductivity-determining impurity atoms, at 0.01 atom % or more; an intrinsic non-crystalline silicon layer, which primarily serves for photoelectric conversion; and an n-type microcrystalline silicon-based layer doped with phosphorus atoms, which are conductivity-determining impurity atoms, at 0.01% or more. Nevertheless, these respective layers are not limited to the foregoing, and for example, it is possible to use a non-crystalline silicon-based layer for the p-type layer, or to use aluminum as the impurity atoms in the p-type microcrystalline silicon-based layer. Further, alloy materials of non-crystalline or microcrystalline silicon carbide or silicon germanium may be used as the p-type layer. The film thickness of the conductive-type (p-type, n-type) microcrystalline silicon-based layer should preferably be 3 to 100 nm, or more preferably 5 to 50 nm. The film thickness of the intrinsic non-crystalline silicon layer should preferably be 0.05 to 0.5 μm. In a photoelectric conversion element provided with an amorphous silicon thin film, however, it is possible to employ a non-crystalline silicon carbide layer (e.g., a non-crystalline silicon carbide layer composed of non-crystalline silicon containing 10 atom % or less of carbon) or a non-crystalline silicon germanium layer (e.g., a non-crystalline silicon germanium layer composed of non-crystalline silicon containing 30 atom % or less of germanium), which are alloy materials, in place of the intrinsic non-crystalline silicon layer. It is preferable that the intrinsic non-crystalline silicon layer be deposited at a substrate temperature of 450° C. or lower in a plasma CVD method. This layer is formed to be a thin film that is substantially intrinsic semiconductive, the density of the conductivity-type-determining impurity atoms of which is $1 \times 10^{18}$ cm$^{-3}$ or less.

The thin film composed of crystalline silicon can be formed by depositing p-, i-, and n-type semiconductor layers in that order by a plasma CVD method in a similar procedure to that for the foregoing thin film composed of amorphous silicon. Alternatively, it can be formed by electron beam vapor deposition using silicon as a raw material, a plasma CVD method that utilizes glow discharge and uses monosilane diluted with a hydrogen gas as a raw material, or a thermal CVD method using monosilane or dichlorosilane. It is preferable that the film thickness of the thin film composed of crystalline silicon be 0.1 to 10 µm, and particularly preferably 5 µm or less. This thin film is formed at, for example, a low temperature of 450° C. or lower in the plasma CVD method and therefore contains a relatively large number of hydrogen atoms for terminating or inactivating grain boundaries and defects in the grains. The hydrogen content in the layer is preferably in a range of 0.5 to 30 atom %, and particularly preferably in a range of 1 to 20 atom %.

In the case of a hybrid tandem-type photoelectric conversion element, the thickness of thin film composed of amorphous silicon is preferably 0.05 to 0.4 µm, and the thickness of the thin film composed of crystalline silicon is preferably 0.5 to 5 µm, although they may depend on the configuration of the photoelectric conversion device.

For reference, the spectral sensitivity characteristic of the thin film composed of amorphous silicon becomes greatest in a wavelength range of about 500 to 600 nm, and it shows the sensitivity only in a wavelength range up to about 800 nm due to the optical energy gap. On the other hand, the thin film composed of crystalline silicon shows the sensitivity up to about 1100 nm.

For the back electrode, it is preferable to form at least one layer of a metallic layer composed of at least one material selected from aluminum (Al), silver (Ag), gold (Au), copper (Cu), platinum (Pt), and chromium (Cr) by a sputtering method or a vapor deposition method. Further, it is possible to form a layer composed of conductive oxide such as ITO, tin oxide, or zinc oxide between the photoelectric conversion layer and the back electrode.

The photoelectric conversion element provided with the thin film composed of crystalline silicon generates a lower open-end voltage and a higher short circuit current density than that provided with the thin film composed of amorphous silicon. For that reason, in a photoelectric conversion device provided with the thin film composed of crystalline silicon, the transmissivity of the transparent conductive film has more influence on its photoelectric conversion efficiency than the sheet resistance value thereof.

EXAMPLES

Hereinbelow, this invention is described in detail with reference to examples. It should be understood, however, that the invention is not intended to be limited by the following examples.

Example 1

A 4-mm thick soda lime glass sheet that was cut into a size of 150×150 mm was placed on a mesh belt and was passed through a heating furnace to be heated to about 600° C. While transferring the heated glass sheet further, a mixed gas composed of monosilane, oxygen, and nitrogen was supplied from a coater installed above the transfer line to form a thin film (undercoating film) having a film thickness of 25 nm and composed of silicon oxide on the glass sheet. After annealing the glass sheet, the glass sheet was again placed on the mesh belt and passed through the heating furnace to be heated to about 620° C. While transferring the heated glass sheet further, a mixed gas composed of tin tetrachloride (vapor), oxygen, water vapor, and nitrogen was supplied from a coater installed above the transfer line to form a thin film (metal-containing thin film) having a film thickness of 30 nm and composed of tin oxide ($SnO_2$) on the undercoating film at a film deposition rate of 50 nm/min. This glass sheet was annealed and thereafter passed through a heating furnace again with it placed on the mesh belt, to be heated to about 620° C. While transferring the heated glass sheet further, a mixed gas composed of tin tetrachloride (vapor), water vapor, nitrogen, and hydrogen fluoride was supplied from a coater installed above the transfer line to deposit a transparent conductive film composed of fluorine-containing tin oxide ($SnO_2$:F) and having a film thickness of 800 nm on the metal-containing thin film at a film deposition rate of 670 nm/min. The gap between the coater and the glass sheet was set at 10 mm, and a nitrogen gas was supplied beside the exhaust section in a curtain-like fashion so that the outside air did not intrude inside the coaters during the formation of the transparent conductive film.

The glass sheet thus obtained had a haze ratio of 22% but showed no white turbidity. For measuring haze ratio, an integrating sphere was used.

Example 2

A transparent conductive film was deposited in a similar manner to Example 1 except that the following points were changed, and the glass sheet was evaluated. The thickness of the undercoating film was changed to 20 nm; as for the metal-containing thin film, the thickness was changed to 100 nm and the film deposition rate to 160 nm/min; and as for the transparent conductive film, oxygen was added to the raw materials, the thickness was changed to 710 nm, and the film deposition rate was changed to 470 nm/min.

This glass sheet had a haze ratio of 17% and showed no white turbidity.

Example 3

A transparent conductive film was deposited in a similar manner to Example 1 except that the following points were changed, and the glass sheet was evaluated. As the glass sheet, an aluminosilicate glass that does not contain alkaline components was used; and as for the metal-containing thin film, using as a metal chloride titanium chloride (vapor) for the raw material, a thin film having a thickness of 20 nm and composed of titanium oxide was formed at a film deposition rate of 30 nm/min. As for the transparent conductive film, oxygen and methyl alcohol were added to the raw materials; the thickness was changed to 900 nm and the film deposition rate was changed to 1000 nm/min.

This glass sheet had a haze ratio of 29% but showed no white turbidity.

Example 4

A transparent conductive film was deposited in a similar manner to Example 1 except that the following points were changed, and the glass sheet was evaluated. As for the metal-containing thin film, oxygen serving as an oxidizing material was eliminated, and it was formed to a film thickness of 30 nm at a film deposition rate of 50 nm/min. As for the transparent conductive film, oxygen was added to its raw materials, and it was deposited to a thickness of 400 nm at a film deposition rate of 330 nm/min.

This glass sheet had a haze ratio of 6% and showed no white turbidity.

Example 5

An undercoating film, a metal-containing thin film, and a transparent conductive film were formed on a glass ribbon in that order utilizing an online CVD method. Specifically, 98 volume % of nitrogen and 2 volume % of hydrogen were supplied to the space inside a float bath so that the inside of the float bath is kept at a slightly higher pressure than that outside the bath. With the inside of the float bath being kept to be a non-oxidizing atmosphere, a mixed gas composed of dimethyltin dichloride (vapor), oxygen, nitrogen, and helium was supplied from a first coater located on the most upstream side to form a thin film (first undercoating layer) having a thickness of 35 nm and composed of tin oxide on the glass ribbon. Subsequently, a mixed gas composed of monosilane, ethylene, oxygen, and nitrogen was supplied from a second coater to form a thin film (second undercoating layer) having a thickness of 25 nm and composed of silicon oxide on the first undercoating layer. Further, a mixed gas composed of dimethyltin dichloride (vapor), oxygen, water vapor, and nitrogen was supplied from a third coater to form a thin film (metal-containing thin film) having a thickness of 100 nm and composed of tin oxide ($SnO_2$) on the second undercoating layer having a surface temperature of 680° C. at a film deposition rate of 2500 nm/min. Using a coater installed on the further downstream side, a mixed gas composed of tin tetrachloride (vapor), water vapor, nitrogen, helium, and hydrogen fluoride was supplied onto the metal-containing thin film having a surface temperature of 630° C. to deposit a transparent conductive film having a film thickness of 670 nm and composed of fluorine-containing tin oxide ($SnO_2$:F) at a film deposition rate of 16700 nm/min.

This glass sheet had a haze ratio of 17% and showed no white turbidity.

Example 6

A transparent conductive film was deposited in a similar manner to Example 5 except that the following points were changed, and the glass sheet was evaluated. The surface temperature of the metal-containing thin film was set at 660° C., and a transparent conductive film having a film thickness of 380 nm was deposited at a film deposition rate of 9500 nm/min.

This glass sheet had a haze ratio 6% and showed no white turbidity.

Example 7

As in Example 5, from the first coater, a mixed gas composed of tin tetrachloride (vapor), water vapor, nitrogen, and helium was supplied to form a thin film (first undercoating layer) having a thickness of 45 nm and composed of tin oxide on a glass ribbon. In addition, from the third coater, a mixed gas composed of tin tetrachloride (vapor), oxygen, water vapor, and nitrogen was supplied to form a thin film (metal-containing thin film) having a thickness of 90 nm and composed of tin oxide ($SnO_2$) on the second undercoating layer having a surface temperature of 680° C. at a film deposition rate of 1830 nm/min. Using a coater installed on the further downstream side, a mixed gas composed of tin tetrachloride (vapor), water vapor, nitrogen, helium, and hydrogen fluoride was supplied on the metal-containing thin film having a surface temperature of 630° C. to deposit a transparent conductive film having a film thickness of 691 nm and composed of fluorine-containing tin oxide ($SnO_2$:F) at a film deposition rate of 7030 nm/min. It should be noted that the conditions that are not specified were similar to those in Example 5.

This glass sheet had a haze ratio of 20% and showed no white turbidity.

Example 8

An undercoating film, a metal-containing thin film, and a transparent conductive film were formed on a glass ribbon in that order utilizing an online CVD method. Specifically, 98 volume % of nitrogen and 2 volume % of hydrogen were supplied to the space inside a float bath so that the inside of the float bath was kept at a slightly higher pressure than that outside the bath. With the inside of the float bath being kept to be a non-oxidizing atmosphere, a mixed gas composed of monosilane, ethylene, oxygen, and nitrogen was supplied from a first coater located on the most upstream side to form on the glass a silicon oxide thin film (undercoating film) having a thickness of 25 nm. Further, a mixed gas composed of tin tetrachloride (vapor), oxygen, water vapor, and nitrogen was supplied from a second coater to form a thin film (metal-containing thin film) having a thickness of 25 nm and composed of tin oxide ($SnO_2$) on the undercoating film having a surface temperature of 680° C. at a film deposition rate of 510 nm/min. Using a coater installed on the further downstream side, a mixed gas composed of tin tetrachloride (vapor), water vapor, nitrogen, helium, and hydrogen fluoride was supplied onto the metal-containing thin film having a surface temperature of 630° C. to deposit a transparent conductive film having a film thickness of 950 nm and composed of fluorine-containing tin oxide ($SnO_2$:F) at a film deposition rate of 5430 nm/min.

This glass sheet had a haze ratio of 18% and showed no white turbidity.

Example 9

An undercoating film, a metal-containing thin film, and a transparent conductive film were formed on a glass ribbon in that order utilizing an online CVD method. Specifically, 98 volume % of nitrogen and 2 volume % of hydrogen were supplied to the space inside a float bath so that the inside of the float bath was kept at a slightly higher pressure than that outside the bath. With the inside of the float bath being kept to be a non-oxidizing atmosphere, a mixed gas composed of tin tetrachloride (vapor), water vapor, nitrogen, and helium was supplied from a first coater located on the most upstream side to form a thin film (first undercoating layer) having a thickness of 35 nm and composed of tin oxide on the glass ribbon. Subsequently, a mixed gas composed of monosilane, ethylene, oxygen, and nitrogen was supplied from a second coater to form a thin film (second undercoating layer) having a thickness of 25 nm and composed of silicon oxide on the first undercoating layer. Further, a mixed gas composed of tin tetrachloride (vapor), oxygen, water vapor, and nitrogen was supplied from a third coater to form a thin film (metal-containing thin film) having a thickness of 140 nm and composed of tin oxide ($SnO_2$) on the second undercoating layer having a surface temperature of 680° C. at a film deposition rate of 2850 nm/min. Using a coater installed on the further downstream side, a mixed gas composed of tin tetrachloride (vapor), water vapor, nitrogen, helium, and hydrogen fluoride was supplied onto the metal-containing thin film having a surface temperature of 630° C. to deposit a transparent conductive film having a film thickness of 636 nm and composed of fluorine-containing tin oxide ($SnO_2$:F) at a film deposition rate of 6470 nm/min.

This glass sheet had a haze ratio of 27% and showed no white turbidity.

Comparative Example 1

In a similar manner to Example 1, a thin film was layered on a glass sheet except that the metal-containing thin film was not formed and the transparent conductive film was deposited directly on the undercoating film.

This glass sheet was observed to have a white turbidity whose appearance was like that seen in frosted glass.

Comparative Example 2

An undercoating film, a metal-containing thin film, and a transparent conductive film were formed on a glass sheet in a similar manner to that in Example 1 except that the film deposition rate for the metal-containing thin film was changed to 900 nm/min.

This glass sheet showed a white turbidity considerably more than the glass of Comparative Example 1.

Comparative Example 3

A transparent conductive film was deposited by an online CVD method in a similar manner to that in Example 5 except that the following points were changed, and the glass sheet was evaluated. The third coater was stopped, and without forming the metal-containing thin film, a transparent conductive film having a film thickness of 600 nm was directly deposited on the second undercoating layer at a film deposition rate of 15000 nm/min.

This glass sheet showed a white turbidity considerably more than Comparative Example 1. This seems to be because with the online CVD method, the transparent conductive film was deposited on the glass ribbon at a high temperature, 630° C.

Comparative Example 4

A transparent conductive film was deposited in a similar manner to Example 5 by an online CVD method except that the following points were changed, and the glass sheet was evaluated. A metal-containing thin film having a thickness of 600 nm was formed on a second undercoating layer having a surface temperature of 690° C. at a film deposition rate of 15000 nm/min. Further, on the metal-containing thin film having a surface temperature of 650° C., a transparent conductive film having a film thickness of 300 nm was deposited at a film deposition rate of 7500 nm/min.

This glass sheet showed a white turbidity.

Reference Example 1

A metal-containing thin film and a transparent conductive film were formed on a glass sheet in a similar manner to that in Example 1 except that no undercoating film was formed.

This glass sheet had a haze ratio of 35% and showed a slight white turbidity.

Next, with the substrates according to this invention, characteristics required for a transparent conductive substrate in a photoelectric conversion device were examined.

Example 10

A 4-mm thick soda lime glass sheet that was cut into a size 150×150 mm was placed on a mesh belt and passed through a heating furnace to be heated to about 600° C. While transferring the heated glass sheet further, a mixed gas composed of monosilane, oxygen, and nitrogen was supplied from a coater installed above the transfer line to form a thin film (undercoating film) having a film thickness of 25 nm and composed of silicon oxide on the glass sheet. After annealing the glass sheet, the glass sheet again was placed on the mesh belt and passed through the heating furnace to be heated to about 620° C. While transferring the heated glass sheet further, a mixed gas composed of tin tetrachloride (vapor), oxygen, water vapor, nitrogen was supplied from a coater installed above the transfer line to form a metal-containing thin film having a film thickness of 30 nm and composed of tin oxide on the undercoating film at a film deposition rate of 50 nm/min. This glass sheet was annealed and thereafter passed through a heating furnace again with it placed on the mesh belt to be heated to about 620° C. While transferring the heated glass sheet further, a mixed gas composed of tin tetrachloride (vapor), water vapor, nitrogen, and hydrogen fluoride was supplied from a coater installed above the transfer line to deposit a transparent conductive film composed of fluorine-containing tin oxide ($SnO_2$:F) and having a film thickness of 800 nm on the metal-containing thin film at a film deposition rate of 670 nm/min. Also, the gap between the coater and the glass sheet was set at 10 mm, and a nitrogen gas was supplied beside the exhaust section in a curtain-like fashion so that the outside air did not intrude inside the coaters during the formation of the transparent conductive film.

The haze ratio of this glass sheet provided with the transparent conductive film, which was measured using an integrating sphere, was 22%, and no white turbid, high-haze state was observed. The reflectivity, absorption coefficient, and sheet resistance are shown in Table 1 below. The reflectivity was obtained by averaging the values with 10 nm intervals in a wavelength range of 400 to 1100 nm, measured from the surface of the glass sheet on which the transparent conductive film is not provided. The absorption coefficients were obtained in the following manner for wavelengths of 400, 500, 600, and 700 nm.

Measurement of Absorption Coefficient

Methylene iodide having a refractive index of 1.79 was applied on the transparent conductive film deposited according to the foregoing Example 10, and a cover glass having a thickness of 1 mm (#7059 manufactured by Corning Inc.) was brought into close contact from thereabove, to prepare a sample in which scattering loss due to the surface roughness of the transparent conductive film is eliminated. The transmissivity and reflectivity of this sample in the visible light range were measured with a spectrophotometer, and from the results, the absorption rate was obtained. Meanwhile, methylene iodide was supplied onto a soda lime glass sheet provided with only the undercoating film according to Example 10, and the above-noted cover glass was brought into close contact from thereabove to prepare a reference sample; with this reference sample as well, the absorptance in the visible light range was obtained in a similar manner to the above. The absorptance of the reference sample was subtracted from the absorptance of the sample, and further by solving the equation taking multiple reflection into consideration, the absorption coefficient of the transparent conductive film was obtained.

Example 11

A glass sheet provided with a transparent conductive film was prepared in a similar manner to Example 10 except that the conditions were changed as specified in the following. On the glass sheet, a thin film (undercoating film) having a film thickness of 20 nm and composed of silicon oxide was formed, and a metal-containing thin film having a film thickness of 100 nm was formed thereon at a film deposition rate of 170 nm/min. Further, a mixed gas composed of tin tetrachloride (vapor), oxygen, water vapor, nitrogen, and hydrogen fluoride was supplied to deposit a transparent conductive film having a thickness of 720 nm and composed of fluorine-containing tin oxide ($SnO_2$:F) on the metal-containing thin film at a film deposition rate of 480 nm/min.

This glass sheet had a haze ratio of 17% and did not show a white turbid, high-haze state. The reflectance, absorption coefficient, and sheet resistance thereof are collectively shown in Table 1 below.

Example 12

A glass sheet provided with a transparent conductive film was prepared in a similar manner to Example 10 except that the conditions were changed as specified in the following. A mixed gas composed of tin tetrachloride (vapor), water vapor, and nitrogen was supplied to form a metal-containing thin film having a film thickness of 50 nm on the undercoating film at a film deposition rate of 510 nm/min. The observation of this buffer layer with an electron microscope confirmed that tin oxide was in a granular state (a state in which individual crystals are clearly larger than those in the metal-containing thin film of Example 10) on the undercoating film. A mixed gas composed of tin tetrachloride (vapor), oxygen, water vapor, nitrogen, and hydrogen fluoride was supplied to deposit a transparent conductive film having a thickness of 950 nm and composed of fluorine-containing tin oxide ($SnO_2$:F) on the undercoating film at a film deposition rate of 8120 nm/min.

This glass sheet had a haze ratio of 29% but did not show a white turbid, high-haze state. The reflectance, absorption coefficient, and sheet resistance thereof are collectively shown in Table 1 below.

Example 13

An undercoating film, a metal-containing thin film, and a transparent conductive film were formed on a glass ribbon in that order utilizing an online CVD method. Specifically, 98 volume % of nitrogen and 2 volume % of hydrogen were supplied to the space inside the float bath so that the space inside the float bath was kept at a slightly higher pressure than that outside the bath. While the inside of the bath was being kept to be a non-oxidizing atmosphere, a mixed gas composed of dimethyltin dichloride (vapor), oxygen, nitrogen, and helium was supplied from the first coater located on the most upstream side to form a thin film (first undercoating layer) having a thickness of 35 nm and composed of tin oxide on the glass ribbon. Subsequently, a mixed gas composed of monosilane, ethylene, oxygen, and nitrogen was supplied from the second coater to form a thin film (second undercoating layer) having a thickness of 25 nm and composed of silicon oxide on the first undercoating layer. Further, a mixed gas composed of dimethyltin dichloride (vapor), oxygen, water vapor, and nitrogen was supplied from the third coater to form a metal-containing thin film having a thickness of 50 nm and composed of tin oxide ($SnO_2$) on the second undercoating layer having a surface temperature of 690° C. at a film deposition rate of 1250 nm/min. Further, using the coater installed on the further downstream side, a mixed gas composed of tin tetrachloride (vapor), water vapor, nitrogen, helium, and hydrogen fluoride was supplied with a glass temperature of 630° C. to deposit a transparent conductive film having a thickness of 740 nm and composed of fluorine-containing tin oxide ($SnO_2$:F) at a film deposition rate of 18500 nm/min.

This glass sheet had a haze ratio of 17% and did not show a white turbid, high-haze state. The reflectance, absorption coefficient, and sheet resistance thereof are shown in Table 1 below.

Example 14

A glass sheet provided with a transparent conductive film was prepared in a similar manner to Example 13 except that the conditions were changed as specified in the following. From the first coater, a mixed gas composed of tin tetrachloride (vapor), water vapor, nitrogen, and helium was supplied to form a thin film (first undercoating layer) having a thickness of 45 nm and composed of tin oxide on the glass ribbon. In addition, from the third coater, a mixed gas composed of tin tetrachloride (vapor), oxygen, water vapor, and nitrogen was supplied to form a metal-containing thin film having a thickness of 90 nm and composed of tin oxide ($SnO_2$) on the undercoating film (second undercoating layer) having a surface temperature of 680° C. at a film deposition rate of 1830 nm/min. Using the coater installed on the further downstream side, a transparent conductive film having a thickness of 690 nm and composed of fluorine-containing tin oxide ($SnO_2$:F) was deposited with a glass temperature of 630° C. at a film deposition rate of 7030 nm/min.

This glass sheet had a haze ratio of 20% and did not show a white turbid, high-haze state. The reflectance, absorption coefficient, and sheet resistance thereof are shown in Table 1 below.

Example 15

A glass sheet provided with a transparent conductive film was prepared in a similar manner to Example 14 except that the conditions were changed as specified in the following. A metal-containing thin film having a thickness of 140 nm and composed of tin oxide ($SnO_2$) was formed on the undercoating film at a film deposition rate of 2850 nm/min. A transparent conductive film having a thickness of 636 nm and composed of fluorine-containing tin oxide ($SnO_2$:F) was deposited at a film deposition rate of 6470 nm/min.

This glass sheet had a haze ratio of 27% and did not show a white turbid, high-haze state. The reflectance, absorption coefficient, and sheet resistance thereof are shown in Table 1 below.

Example 16

A glass sheet provided with a transparent conductive film was prepared in a similar manner to Example 14 except that the conditions were changed as specified in the following. A thin film (first undercoating layer) having a thickness of 80 nm and composed of tin oxide was formed on a glass ribbon. A transparent conductive film having a thickness of 710 nm and composed of fluorine-containing tin oxide ($SnO_2$:F) was deposited on the metal-containing thin film at a film deposition rate of 7220 nm/min.

This glass sheet had a haze ratio of 25% and did not show a white turbid, high-haze state. The reflectance, absorption coefficient, and sheet resistance thereof are shown in Table 1 below.

Example 17

A glass sheet provided with a transparent conductive film was prepared in a similar manner to Example 14 except that the conditions were changed as specified in the following. A transparent conductive film having a thickness of 670 nm and composed of fluorine-containing tin oxide ($SnO_2$:F) was deposited on a metal-containing thin film at a film deposition rate of 6820 nm/min.

This glass sheet had a haze ratio of 16% and did not show a white turbid, high-haze state. The reflectance, absorption coefficient, and sheet resistance thereof are shown in Table 1 below.

Comparative Example 5

A glass sheet provided with a transparent conductive film was prepared in a similar manner to Example 10 except that the conditions were changed as specified in the following. Without forming the buffer layer (metal-containing thin film) on the undercoating film, a transparent conductive film composed of fluorine-containing tin oxide ($SnO_2$:F) was deposited directly.

This glass sheet on which the buffer layer was not formed showed such a white turbid, high-haze state that an object behind the glass sheet could not be recognized. For that reason, measurements of haze ratio, reflectance, absorption coefficient, and sheet resistance value were not carried out.

Comparative Example 6

The glass sheet provided with a transparent conductive film was prepared in a similar manner to Example 13 except that the conditions were changed as specified in the following. Without forming a buffer layer (metal-containing thin film) on the undercoating film, that is, with the supply of the mixed gas being stopped for the third coater, a transparent conductive film having a thickness of 600 nm and composed of fluorine-containing tin oxide ($SnO_2$:F) was deposited at a film deposition rate of 15000 nm/min.

This glass sheet on which the buffer layer was not formed showed such a white turbid, high-haze state that an object behind the glass sheet could not be recognized. For that reason, measurements of haze ratio, reflectance, absorption coefficient, and sheet resistance value were not carried out.

Manufacturing Example 1

A thin film having a thickness of 0.3 μm and composed of amorphous silicon was formed on each of the transparent conductive films deposited according to Examples 10, 11, 13 to 17, and Comparative Examples 5 and 6, by a plasma CVD method using monosilane and hydrogen as raw materials. Thereafter, by electron beam vapor deposition, a thin film (back electrode) having a thickness of 300 nm composed of silver was formed, and samples of photoelectric conversion elements were thus prepared. These samples are made in accordance with a general configuration of a solar cell in which a thin film composed of amorphous silicon serves as its photoelectric conversion layer. The photoelectric conversion efficiencies of these samples were measured using a known technique, the results of which are collectively shown in Table 1 below.

Manufacturing Example 2

A thin film having a thickness of 2 μm and composed of crystalline silicon was formed on each of the transparent conductive films deposited according to Examples 10, 11, and 13 as well as Comparative Examples 5 to 6, by a plasma CVD method using monosilane and hydrogen as raw materials. Thereafter, by electron beam vapor deposition, a thin film (back electrode) having a thickness of 300 nm and composed of silver was formed, and samples of photoelectric conversion elements were thus prepared. These samples are made according to a general configuration of a solar cell in which a thin film composed of crystalline silicon serves as its photoelectric conversion layer. The photoelectric conversion efficiencies of these samples were measured using a known technique, and the results are collectively shown in Table 1 below.

For the photoelectric conversion efficiencies of Comparative Examples 5 and 6 in Manufacturing Examples 1 and 2, measurement of the photoelectric conversion efficiencies was attempted, but almost no efficiency was obtained. This may be due to the fact that the p-, i-, and n-type thin films composed of amorphous silicon and the thin film composed of crystalline silicon were not formed uniformly within the surface because of the giant particles of tin oxide observed as white turbidity.

The comparison between Example 12 and Comparative Example 5 demonstrates that when the film deposition rate for the buffer layer exceeds 600 nm/min., the transparent conductive film forms a white turbidity. In Examples 13 to 17, the transparent conductive films did not cause a white turbidity even though the film deposition rate for the buffer layer greatly exceeds 1000 nm/min; this may be attributed to the fact that alkali-halogen particles were taken into the first undercoating layer during the formation of the first undercoating layer, or disappeared because of the heat, and as a consequence the surface of the undercoating film became non-flat.

For reference purposes, a measurement was carried out to examine how the absorption coefficient of a transparent conductive film changes when raw materials of the transparent conductive film were varied in their contents of the compositional components (Reference Examples 2 to 4).

Reference Example 2

A glass sheet provided with a transparent conductive film was prepared in a similar manner to that in Example 14 except that the conditions were changed as specified in the following. On the glass ribbon, a thin film (first undercoating layer) having a thickness of 35 nm and composed of tin oxide was formed. On the undercoating film (second undercoating layer), a metal-containing thin film having a thickness of 110 nm and composed of tin oxide ($SnO_2$) was formed at a film deposition rate of 1550 nm/min. Further, a mixed gas composed of 1.8 mol % tin tetrachloride (vapor), 57 mol % water vapor, nitrogen, and hydrogen fluoride was supplied to deposit a transparent conductive film having a thickness of 504 nm and composed of fluorine-containing tin oxide ($SnO_2$:F) on the metal-containing thin film at a film deposition rate of 3480 nm/min. This glass sheet had a haze ratio of 3.3% and showed absorption coefficients of 0.53 at 400 nm, 0.36 at 500 nm, 0.26 at 600 nm, and 0.24 at 700 nm.

Reference Example 3

A glass sheet provided with a transparent conductive film was prepared in a similar manner to that in Reference Example 2 except that the conditions were changed as specified in the following, and the absorption coefficient thereof was measured. As a raw material of the transparent conductive film, a mixed gas was used whose contents of the compositional components were 1.8 mol % tin tetrachloride (vapor), 57 mol % water vapor, 23 mol % oxygen, nitrogen, and hydrogen fluoride to deposit a transparent conductive film having a thickness of 500 nm and composed of fluorine-containing tin oxide ($SnO_2$:F) at a film deposition rate of 3450 nm/min. This glass sheet had a haze ratio of 3% and showed absorption coefficients of 0.64 at 400 nm, 0.32 at 500 nm, 0.24 at 600 nm, 0.17 at 700 nm.

Reference Example 4

A glass sheet provided with a transparent conductive film was prepared in a similar manner to that in Reference Example 2 except that the conditions were changed as specified in the following, and the absorption coefficient thereof was measured. As a raw material of the transparent conductive film, a mixed gas was used whose contents of the compositional components were 1.8 mol % tin tetrachloride (vapor), 85.6 mol % water vapor, nitrogen, and hydrogen fluoride to deposit a transparent conductive film having a thickness of 453 nm and composed of fluorine-containing tin oxide ($SnO_2$:F) at a film deposition rate of 3120 nm/min. This glass sheet had a haze ratio of 3.5% and showed absorption coefficients of 0.76 at 400 nm, 0.4 at 500 nm, 0.26 at 600 nm, 0.17 at 700 nm.

The comparison between Reference Examples 1 to 3 demonstrates that when the content of the oxidizing material (oxygen or water vapor) in the mixed gas of the raw material is higher, the absorption coefficients toward long wavelengths reduce.

With the configurations described thus far, this invention exhibits the following advantageous effects.

With a thin film-forming method according to this invention, the generation of giant crystal grains is suppressed even if the film deposition rate for the thin film containing a crystalline metal oxide as the main component is made faster. As a consequence, even when the thin film containing a crystalline metal oxide as the main component is formed on a transparent substrate at a high film deposition rate, white turbidity does not easily occur, and moreover, even when a functional film is formed on the foregoing thin film, defects do not easily form. Therefore, the use of this thin film-forming method enables the manufacture of a substrate provided with a high quality thin film containing a crystalline metal oxide as the main component to be highly efficient. Moreover, since a substrate according to this invention has a transparent conductive film provided with relatively uniform and large surface roughness, transmitted light and reflected light are scattered effectively; therefore, the light trapping effect is exhibited effectively. Furthermore, with its low reflectivity and low absorption coefficient, this transparent conductive film can increase the conversion efficiency in photoelectric conversion when used for a photoelectric conversion device.

TABLE 1

|  |  |  | Example 10 | Example 11 | Example 12 | Example 13 | Example 14 | Example 15 |
|---|---|---|---|---|---|---|---|---|
| Undercoating Film | First Undercoating Layer Thickness (nm) |  | — | — | — | 35 | 45 | 45 |
|  | Second Undercoating Layer Thickness (nm) |  | 25 | 20 | 25 | 25 | 25 | 25 |
| Buffer Layer | Thickness | (nm) | 30 | 100 | 50 | 50 | 90 | 140 |
|  | Deposition Temp. | (° C.) | 620 | 620 | 620 | 690 | 680 | 680 |
|  | Film Deposition Rate | (nm/min.) | 50 | 170 | 510 | 1250 | 1830 | 2850 |
| Transparent Conductive Film | Thickness | (nm) | 800 | 720 | 950 | 740 | 690 | 636 |
|  | Deposition Temp. | (° C.) | 620 | 620 | 620 | 630 | 630 | 630 |
|  | Film Deposition Rate | (nm/min.) | 670 | 480 | 8120 | 18500 | 7030 | 6470 |
| Substrate Characteristics | Haze Ratio | (%) | 22 | 17 | 29 | 17 | 20 | 27 |
|  | Reflectivity (400-1100 nm average) |  | 11.5 | 12.8 | 9.3 | 8.5 | 9.4 | 9.4 |
|  | Absorption Coefficient ($\times 10^3$ cm$^{-1}$) | 400 (nm) | 0.36 | 0.38 | 0.45 | 0.40 | 0.57 | 0.59 |
|  |  | 500 (nm) | 0.36 | 0.37 | 0.37 | 0.39 | 0.40 | 0.51 |
|  |  | 600 (nm) | 0.35 | 0.35 | 0.39 | 0.38 | 0.35 | 0.43 |
|  |  | 700 (nm) | 0.35 | 0.36 | 0.57 | 0.38 | 0.38 | 0.47 |
|  | Sheet Resistance | (Ω/□) | 10 | 13 | 10.4 | 15 | 10.6 | 9.2 |
| Photoelectric Conversion Device | Photoelectric Conversion Efficiency | Amorphous Film (%) | 7.8 | 7.8 | — | 7.7 | 8.65 | 9.5 |
|  |  | Crystalline Film (%) | 7.3 | 7.2 | — | 7.1 | — | — |

|  |  |  | Example 16 | Example 17 | Comp. Example 5 | Comp. Example 6 |
|---|---|---|---|---|---|---|
| Undercoating Film | First Undercoating Layer Thickness (nm) |  | 80 | 45 | — | 35 |

TABLE 1-continued

| | | | | | | |
|---|---|---|---|---|---|---|
| | Second Undercoating Layer Thickness (nm) | | 25 | 25 | 25 | 25 |
| Buffer Layer | Thickness | (nm) | 90 | 90 | — | — |
| | Deposition Temp. | (° C.) | 680 | 680 | — | — |
| | Film Deposition Rate | (nm/min.) | 1830 | 1830 | — | — |
| Transparent Conductive Film | Thickness | (nm) | 710 | 670 | 800 | 600 |
| | Deposition Temp. | (° C.) | 630 | 630 | 620 | 630 |
| | Film Deposition Rate | (nm/min.) | 7220 | 6820 | 670 | 15000 |
| Substrate Characteristics | Haze Ratio | (%) | 25 | 16 | White Turbidity | White Turbidity |
| | Reflectivity (400-1100 nm average) | | 11.0 | 9.4 | — | — |
| | Absorption Coefficient ($\times 10^3$ cm$^{-1}$) | 400 (nm) | 0.65 | 0.56 | — | — |
| | | 500 (nm) | 0.51 | 0.42 | — | — |
| | | 600 (nm) | 0.44 | 0.36 | — | — |
| | | 700 (nm) | 0.45 | 0.37 | — | — |
| | Sheet Resistance | ($\Omega/\square$) | 10 | 13.2 | — | — |
| Photoelectric Conversion Device | Photoelectric Conversion Efficiency | Amorphous Film (%) | 8.61 | 9.76 | 1.1 | 0.8 |
| | | Crystalline Film (%) | — | — | 0.6 | 0.5 |

The invention claimed is:

1. A method of forming a transparent conductive film that is a thin film containing a crystalline metal oxide as a main component on a glass substrate by a thermal decomposition method, comprising:
    forming an undercoating film containing silicon oxide as a main component on the glass substrate;
    forming the transparent conductive film by supplying a first raw material that is a gas containing a chloride of a metal through a first coater; and
    prior to the forming of the transparent conductive film, forming on the undercoating film, at a film deposition rate slower than a film deposition rate for the transparent conductive film, a buffer layer that is a metal-containing thin film by a thermal decomposition method including supplying a second raw material containing a chloride of a metal through a second coater, wherein
    the transparent conductive film is formed directly on the buffer layer,
    the thickness of the buffer layer is 10 to 250 nm,
    the thickness of the transparent conductive film is 500 to 1000 nm,
    the film deposition rate for the buffer layer is 1250 to 2850 nm/min.,
    the film deposition rate for the transparent conductive film is 6300 nm/min. or greater and,
    the haze ratio of the glass substrate having formed thereon the undercoating film, the buffer layer and the transparent conductive film is 29% or lower.

2. The method according to claim 1, wherein the chloride of a metal is tetrachloride of a metal.

3. The method according to claim 1, wherein the glass substrate is a glass ribbon in a float process, and the transparent conductive film is formed in a float bath.

4. The method according to claim 1, wherein the first raw material includes water vapor.

\* \* \* \* \*